US007141853B2

(12) United States Patent
Campbell et al.

(10) Patent No.: US 7,141,853 B2
(45) Date of Patent: Nov. 28, 2006

(54) METHOD AND STRUCTURE FOR BURIED CIRCUITS AND DEVICES

(75) Inventors: John E. Campbell, Wappingers Falls, NY (US); William T. Devine, Ulster Park, NY (US); Kris V. Srikrishnan, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 10/832,894

(22) Filed: Apr. 27, 2004

(65) Prior Publication Data

US 2005/0029592 A1  Feb. 10, 2005

Related U.S. Application Data

(62) Division of application No. 09/879,530, filed on Jun. 12, 2001, now Pat. No. 6,759,282.

(51) Int. Cl.
H01L 27/01 (2006.01)
(52) U.S. Cl. .......................................... 257/347; 257/351
(58) Field of Classification Search ................ 257/347, 257/351
See application file for complete search history.

(56) References Cited

U.S. PATENT DOCUMENTS

| 4,341,009 A | 7/1982 | Bartholomew et al. |
| 5,343,064 A | 8/1994 | Spangler et al. |
| 5,374,564 A | 12/1994 | Bruel |
| 5,376,561 A | 12/1994 | Vu et al. |
| 5,473,181 A | 12/1995 | Schwalke et al. |
| 5,547,886 A | 8/1996 | Harada |
| 5,604,368 A | 2/1997 | Taur et al. |
| 5,631,186 A | 5/1997 | Park et al. |
| 5,646,058 A | 7/1997 | Taur et al. |
| 5,654,220 A | 8/1997 | Leedy |
| 5,656,548 A | 8/1997 | Zavracky et al. |
| 5,670,387 A | 9/1997 | Sun |
| 5,736,435 A | 4/1998 | Venkatesan et al. |
| 5,741,733 A | 4/1998 | Bertagnolli et al. |
| 5,767,001 A | 6/1998 | Bertagnolli et al. |
| 5,844,294 A | 12/1998 | Kikuchi et al. |
| 5,882,987 A | 3/1999 | Srikrishnan |
| 5,889,293 A | 3/1999 | Rutten et al. |
| 5,889,302 A | 3/1999 | Liu |
| 5,891,761 A | 4/1999 | Vindasius et al. |
| 5,939,745 A | 8/1999 | Park et al. |
| 5,970,339 A | 10/1999 | Choi |
| 5,998,808 A | 12/1999 | Matsushita |
| 6,037,617 A | 3/2000 | Kumagai |
| 6,067,062 A | 5/2000 | Takasu et al. |

(Continued)

OTHER PUBLICATIONS

IBM Technical Disclosure Bulletin, "Stacked Technology For Random-Access Memory Construction", vol. 29, No. 8 Jan. 1987, pp. 3428-3429.

(Continued)

Primary Examiner—T. N. Quach
(74) Attorney, Agent, or Firm—Ira D. Blecker

(57) ABSTRACT

A method and structure for fabricating an electronic device using an SOI technique that results in formation of a buried oxide layer. The method includes fabricating at least one first component of the electronic device and fabricating at least one second component of the electronic device, wherein the first component and the second component are on opposite sides of the buried oxide layer, thereby causing the buried oxide layer to perform a function within the electronic device.

Entire circuits can be designed around this technique.

11 Claims, 15 Drawing Sheets

U.S. PATENT DOCUMENTS

| | | |
|---|---|---|
| 6,096,582 A | 8/2000 | Inoue et al. |
| 6,188,122 B1 | 2/2001 | Davari et al. |
| 6,291,858 B1 | 9/2001 | Ma et al. |
| 6,384,439 B1 | 5/2002 | Walker |
| 6,531,741 B1 * | 3/2003 | Hargrove et al. |
| 6,531,754 B1 | 3/2003 | Nagano et al. |
| 6,538,916 B1 | 3/2003 | Ohsawa |
| 6,548,848 B1 | 4/2003 | Horiguchi et al. |
| 2002/0063285 A1 | 5/2002 | Wu et al. |

OTHER PUBLICATIONS

A.J. Auberton-Herve, "SOI: Materials to Systems", IEE, 0-7803-3393-4, 1996, IEDM 96-3 to 96-10.

Koh et al., "Body-Contacted SOI MOSFET Structure with Fully Bulk CMOS Compatible Layout and Process", IEEE Electron Device Letters, Mar. 1997, pp. 1-2-104.

"Double-Gate MOSFET Demonstrates 25-nm Thick Channel", Solid State Technology, Mar. 1998, pp. 24-26 (Abstract).

Lei et al., "Characterization of Polysilicon Oxides Thermally Grown and Deposited on the Polished Polysilicon Films", IEEE Transactions on Electronic Devices, Apr. 1998, pp. 912-917.

* cited by examiner

DYNAMIC TWO PHASE SHIFT REGISTER

METHOD AND STRUCTURE FOR BURIED CIRCUITS AND DEVICES

CROSS-REFERENCE TO RELATED APPLICATONS

This application is a Division of U.S. patent application Ser. No. 09/879,530 filed Jun. 12, 2001 now U.S. Pat. No. 6,759,282, the disclosure of which is hereby incorporated herein by reference.

BACKGROUND OF THE INVENTION

1. Field of the Invention

The present invention involves fabrication of semiconductor devices using Silicon-on-Insulator (SOI) technology. More specifically the invention is directed to the use of the SOI Buried Oxide (BOX) layer as an integral component of electronic devices and circuits.

2. Description of the Related Art

Silicon-On-Insulator (SOI) technology has emerged as an electronic fabrication technique that improves characteristics such as latchup and speed, although typically at higher manufacturing cost. The term SOI typically describes structures where devices are fabricated in single-crystal Si layers formed over an insulating film or substrate.

FIGS. 11A and 11B show a typical conventional SOI structure, where a thin silicon device layer 110 formed on an insulator 111 is supported over substrate 112. For current technology the substrate is most commonly silicon and the insulator is most commonly silicon dioxide. Devices 113 are formed in device layer 110 and interconnected by surface conductors 114. The conventional SOI structure is predominantly created by one of two techniques.

The first process, known as SIMOX (Separation by IMplanted Oxygen), consists of implantation of oxygen into an Si substrate at a prescribed depth and heating it to form a continuous layer of $SiO_2$. The SIMOX process requires only a single wafer. The alternate process, shown in greater detail later, is commonly referred to as "Bonded SOI" and starts with two wafers, preferably with at least one having an oxide surface. The first wafer is the carrier wafer which is joined together with the second wafer, and the second wafer is "thinned" to leave a layer of silicon bonded onto the carrier wafer, separated by an insulator layer.

Both of the techniques have experienced many variations and enhancements over the years for improvement of yield and lower cost and to achieve desirable device layer quality for uniformity and defects. An important characteristic of conventional SOI that is obvious from FIG. 11B is that the insulator layer 111 is used primarily for isolating the silicon device layer 110 with its active devices 113 from the silicon substrate 112. Thus, the conventional wisdom forms devices on the device layer 110 on only one side of the insulator layer 111.

The problem with this approach is that, although devices and interconnects are formed similar to conventional substrates, SOI techniques introduce newer problems such as floating body effects. Additionally, conventional SOI structure takes up considerably more chip "real estate" than required in corresponding non-SOI structure, since floating body effects which not an issue with conventional substrates require additional connections to the channel regions. There are also added process steps to provide ground interconnections to the substrate. More important, the conventional approach fails to recognize that the insulator layer could provide more functionality than merely separating predetermined groups of devices from the substrate.

SUMMARY OF THE INVENTION

The inventors have recognized that the SOI insulator layer, or BOX (Buried OXide), can be an integral part of a specific device, and further, even circuits can be advantageously built around this innovative approach. That is to say, the BOX can be considered more than a mere passive isolation mechanism separating layers of devices. It can become an integral component even of an entire circuit. As will be demonstrated, by adopting this innovative approach, a whole new possibility opens up for SOI technology that provides improved device density and speed and fewer conductor interconnects between devices.

Therefore, an object of the invention is to teach methods in which the SOI insulator (BOX) is used as a building component at the device level.

Another object of the invention is to teach methods in which the BOX serves as a building component at the circuit level.

Another object of the present invention is to teach a method in which the BOX is used for functions other than simple isolation between layers of devices.

Another object of the present invention is to teach a method in which the BOX is even used for functions other than isolation even within a single device.

Another object of the present invention is to improve electronic device density on SOI chips.

Another object of the present invention is to reduce the number of conductor interconnects between devices on SOI chips.

Another object of the present invention is to reduce parasitics and increase speed on SOI chips.

Another object of the present invention is to teach methods for forming features in the substrate prior to the formation of SOI structure.

Another object of the present invention is to teach methods to form improved FET devices on SOI.

A still further object of the invention is to demonstrate applications that take advantage of the above methods.

Yet another object of the invention is to demonstrate the above goals and techniques using established silicon manufacturing processes and equipment.

To achieve the above objects according to a first aspect of the invention, a method and structure is disclosed of fabricating an electronic device using an SOI technique resulting in formation of a buried oxide layer. The method includes fabricating at least one first component of the electronic device and fabricating at least one second component of the electronic device, where the first component and the second component are on opposite sides of the buried oxide layer so that the buried oxide layer performs a function within the electronic device.

According to a second aspect of the invention, a method is disclosed of fabricating an electronic circuit using an SOI technique, said SOI technique resulting in formation of at least one buried oxide layer, the electronic circuit comprising a plurality of interconnected electronic devices, each electronic device comprising a respective plurality of components. The method includes fabricating a predetermined first set of respective plurality of components to be on a first side of the buried oxide layer and fabricating a predetermined second set of respective plurality of components to be on a second side of the buried oxide layer, where the second side is the opposite side of the first side, and where the buried oxide layer performs a function integral to the functioning of at least one of the electronic devices.

According to a third aspect of the invention, a method is disclosed of SOI fabrication in which a buried oxide layer is formed, where the method includes forming a first set of device components to be on a first side of the buried oxide layer and forming a second set of device components to be on the side opposite the first side, where the buried oxide layer performs a function integral to the functioning of at least one device comprised of components from the first set of components and components from the second set of components.

According to a fourth aspect of the invention, a method and structure are disclosed of fabricating a DRAM cell using an SOI technique on a substrate, where the SOI technique results in formation of at least one buried oxide layer. The method includes forming a buried capacitor beneath the buried oxide layer, subsequently forming an FET source and drain regions on top of the buried oxide layer, and interconnecting the capacitor to one of the source region or drain region with a via penetrating the buried oxide layer, where the via is a conductive material.

According to a fifth aspect of the invention, a method and structure are disclosed of fabricating a DRAM cell using an SOI technique, where the SOI technique results in formation of at least one buried oxide (BOX) layer, whereby a capacitor for the DRAM cell is formed by a process including forming a buried electrode in a substrate, wherein the buried electrode serves as a lower capacitor charge plate and forming a diffusion link between the diffusion region of a transistor located on the upper side of the BOX and a region to comprise an upper charge plate of the capacitor, where the upper charged plate of the capacitor is formed on the upper side of the BOX when impressing a bias voltage on the buried electrode.

According to a sixth aspect of the invention, a method and structure are disclosed of fabricating an electronic circuit having a plurality of electronic devices using an SOI technique, the SOI technique resulting in formation of at least one buried oxide layer. The method includes forming an interconnector of conductive material to interconnect at least two of said plurality of electronic devices, the interconnector at least partially enclosed by said buried oxide.

According to a seventh aspect of the invention, a method and structure are disclosed of fabricating a dynamic two-phase shift register. The method includes forming a buried oxide layer using an SOI technique, forming a plurality of FET transistors to be in a device layer above the buried oxide layer, forming a first clock signal conductor on top of the device layer, and forming a second clock signal conductor below the device layer, the second clock signal conductor at least partially enclosed by the buried layer.

According to an eighth aspect of the invention, a method and structure are disclosed of fabricating a CMOS circuit. The method includes forming a buried oxide layer using an SOI technique and forming a plurality of FET transistors to be in a device layer above the buried oxide layer, wherein at least two of the FET transistors share a common diffusion region, thereby electrically interconnecting the two FET transistors without using a separate interconnecting conductive material.

According to a ninth aspect of the invention, a method and structure are disclosed of fabricating a FET using an SOI technique, the SOI technique resulting in formation of at least one buried oxide layer. The method includes forming a first gate beneath the buried oxide layer and forming a second gate on top of the buried oxide layer.

According to a tenth aspect of the invention, a structure is disclosed of an electronic device including at least one SOI buried oxide layer, where the at least one buried oxide layer performs a function integral to the device.

According to an eleventh aspect of the invention, a structure is disclosed of an electronic device comprising at least one SOI buried oxide layer, where the at least one SOI buried oxide layer becomes a structural element integral to the device.

According to a twelfth aspect of the invention, a structure is disclosed of an electronic circuit comprising a plurality of interconnected devices, the circuit mounted on a wafer having at least one SOI buried oxide layer, wherein the at least one SOI buried oxide layer is a functional element integral to at least one of the devices.

According to a thirteenth aspect of the invention, a structure is disclosed of an electronic circuit comprising a plurality of interconnected devices, the circuit mounted on a wafer having at least one SOI buried oxide layer, where the at least one SOI buried oxide layer comprises a structural element integral to at least one of the devices.

According to a fourteenth aspect of the invention, a structure is disclosed of an electronic circuit comprising a plurality of interconnected devices, the circuit mounted on a wafer having at least one SOI buried oxide layer, where the two adjacent devices share at least one device component, thereby electrically interconnecting the two devices without an interconnecting conductor, and where the SOI buried oxide layer serves to isolate components of the two interconnected devices other than the shared component.

According to a fifteenth aspect of the invention, a method is disclosed of SOI fabrication wherein a buried oxide layer is formed. The method includes forming a first set of device components to be on a first side of the buried oxide layer and forming a second set of device components to be on the side opposite, where the buried oxide layer is used for an active functioning of at least one buried device.

BRIEF DESCRIPTION OF THE DRAWINGS

The foregoing and other objects, aspects and advantages will be better understood from the following detailed description of a preferred embodiment of the invention with reference to the drawings, in which.

Note that the drawings are drawn more to illustrate the inventive processes and structures and are not drawn to scale.

DETAILED DESCRIPTION OF THE PREFERRED EMBODIMENTS

Figure 11A:
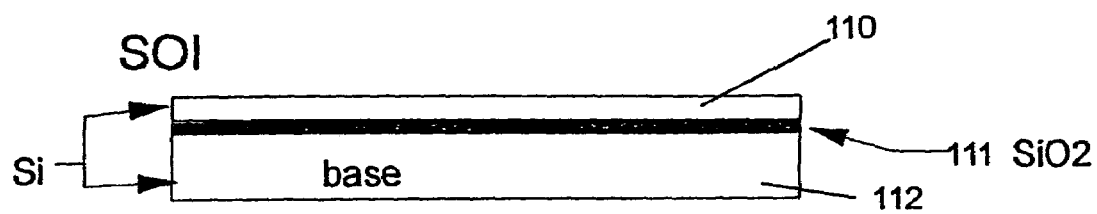
FIGS. 11a, 11b show conventional SOI structures.
Figure 11B:
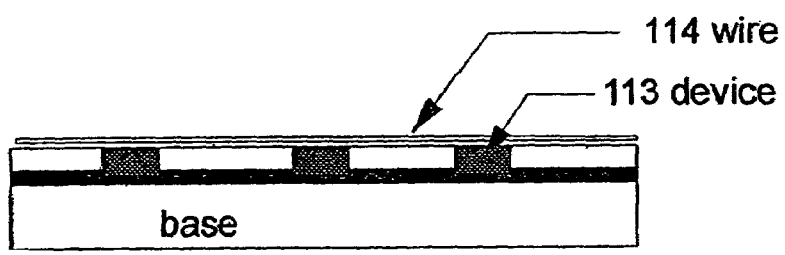

Going back to FIGS. 11A–11B illustrating the conventional SOI device, wherein oxide layer 111 separates device layer 110 from substrate 112. FET devices 113 are built into device layer 110. One conventional technique forms FET transistors with the following steps: a gate oxide is formed by a surface oxidation of layer 110, a gate electrode is formed by deposition and patterning of polysilicon, and source and drain regions are formed by implantation of a dopant. These source/drain regions, gate electrodes can then be surface wired 114 by common interconnection processes.

Figure 1A:
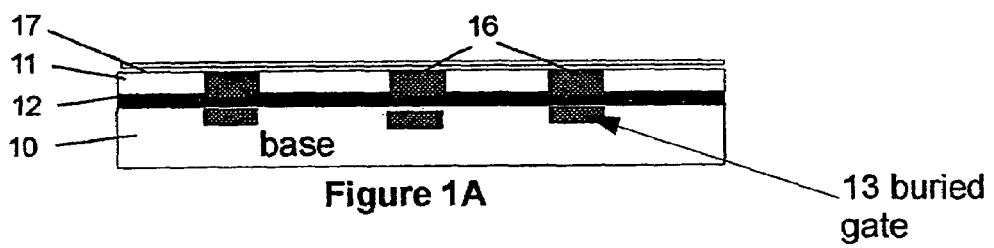
FIGS. 1A–1C show three exemplary kinds of structure formed in the supporting silicon body which illustrate how the BOX can be advantageously used.
Figure 1B:
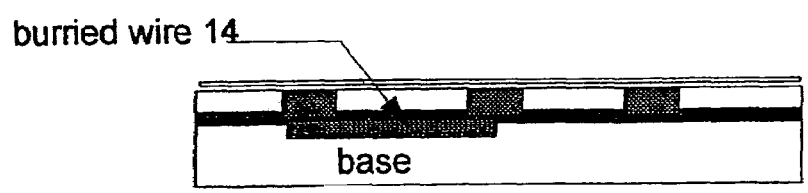
Figure 1C:
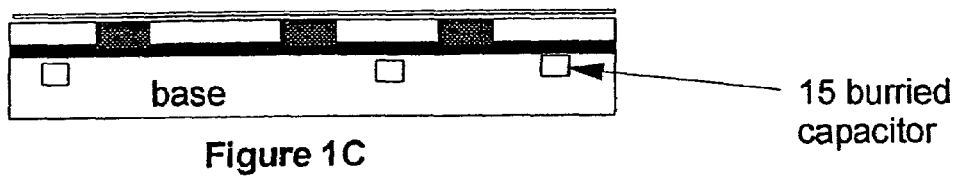
Figure 2:
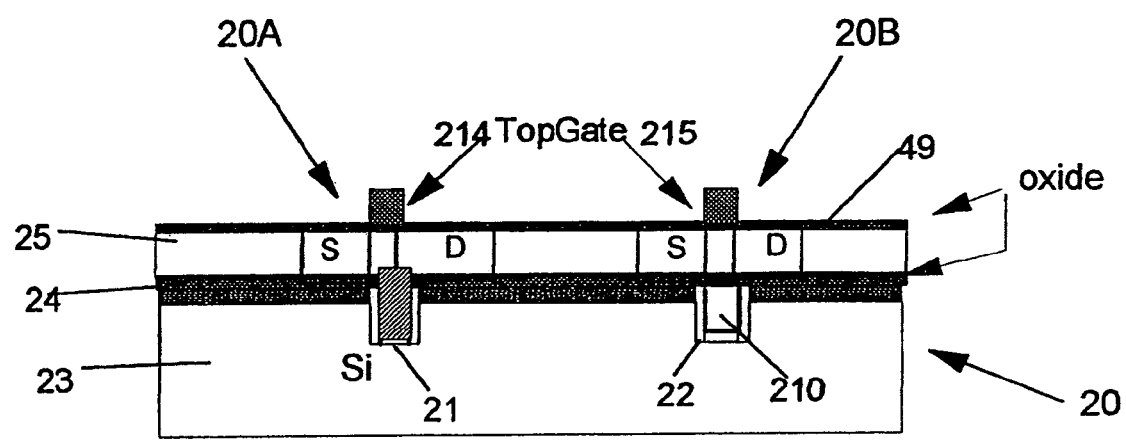
FIG. 2 shows exemplary device structures using the techniques taught in the invention.

Turning now to the invention, FIGS. 1A–1C illustrate respectively a buried gate 13, a buried wire 14, and a buried capacitor 15 which are exemplary structures resulting from the present invention to use the BOX 12 as an integral part of devices and even entire circuits. Either the SIMOX technique or the bonded technique can be used. Substrate 10 receives device components which are then complemented with components 16 in the device layer 11 above BOX 12. Similar to conventional SOI structures of FIGS. 11A–11B, surface conductors 17 could still be used to interconnect devices if desired, although the invention permits interconnections in a different manner. Details of forming these structures and the advantages of the invention will become obvious to one skilled in the art after an understanding of the following sections FIG. 2 shows an exemplary SOI structure 20 in which two FETs 20A, 20B are constructed with the BOX 24 as an integral part at the device level. Buried elements 21,22 have been formed in the lower section 23. In this discussion element 21 is a body contact and element 22 is a buried gate. BOX 24 separates lower section 23 from upper section 25 containing additional source and drain regions 26, 27.

FIGS. 2A through 3D show an exemplary formation using the bonded SOI techniques to result in the structure 20 shown in FIG. 2. An exemplary formation using SIMOX is illustrated in FIGS. 4A–4E. The buried elements 13, 14, 15 shown in FIGS. 1A–1C demonstrate that the buried elements 21, 22 in FIG. 2 could be variously a gate, capacitor, or wire, depending on the process/material used in forming the elements. Therefore, it should be obvious that a great variety of devices can be constructed using the concepts taught by this invention.

Figure 2A:
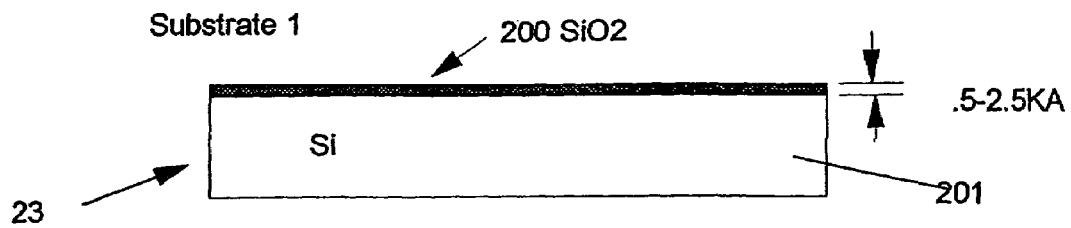
FIGS. 2A–2E show exemplary structures formed in the lower section silicon body prior to forming SOI substrate.

Concerning the bonded technique, FIG. 2A shows a method of constructing lower section 23 whereby a silicon dioxide layer 200 having thickness of 250–2500 A is formed on a silicon carrier substrate 201. This layer 200 and its thickness is not critical since it is used as a selective mask in etching trenches 202. It is quite likely that the insulator etch and later on polysilicon polish process will remove some of the oxide layer. In a preferred process, the BOX layer will be reformed after removing any residual mask layer at the same step as forming trench sidewall insulator. If needed, a silicon nitride layer 203 (not shown) of thickness in the range of 500–2500 A is used in addition to silicon dioxide 200. Silicon nitride, although not intended as part of the BOX layer, can provide good selectivity for etching and chemical mechanical polishing and will protect the underlying oxide or the substrate. When nitride is used on top of an oxide layer, any remaining nitride layer after completion of buried structures in substrate 23 will be removed prior to bonding it to the device wafer. The final insulator stack for the mask layer preferably comprises oxide/nitride/oxide layers, although not all layers are essential. The thicknesses of the insulators are chosen depending on the depth of the trench 202 which in turn depends upon the specific component to be placed in the trench, but typically the combined thickness of the insulator stack is less than 5000 A. For forming a buried gate 13 (see FIG. 1A), the trench depth 204 is typically about 2000–5000 A, similar to the typical thickness of gate electrodes. For forming a buried wiring layer 14 (FIG. 1B), the depth of the trench is typically in the range of 5000 Angstroms to 2 micron. For forming a trench capacitor 15 (FIG. 1C), a larger depth of the order of 2–6 microns is chosen.

Figure 2B:
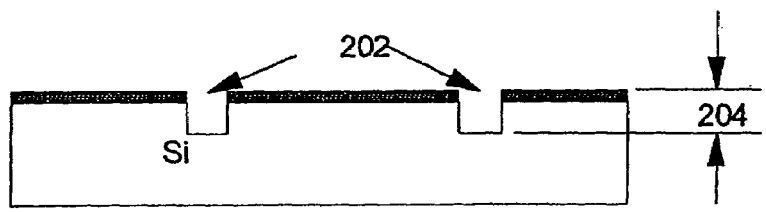

The process of etching vertical trenches in silicon substrate is well known. For example, for the exemplary buried gate process a standard lithography can be used to create the pattern in a resist mask, followed by a directional etching using a $Cl_2$/Ar plasma such as described in U.S. Pat. No. 4,139,442, assigned to the assignee and incorporated herein by reference. Other commercially available etch processes are also satisfactory for the trench etch. After removing the resist mask, the substrate is similar to that shown in FIG. 2B.

Figure 2C:
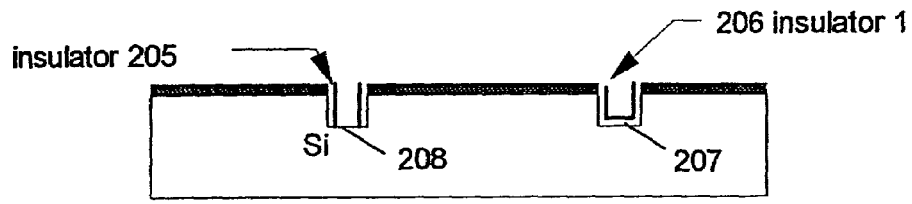

Subsequently, as shown in FIG. 2C, to further develop the buried gate structure, an insulation layer 205, 206 will be incorporated on the sides/bottom of the trenches 202. This insulator layer 205, 206 typically would be an oxide or nitride layer or a combination thereof and is formed by depostion, insitu conversion of silicon, or a combination of processes. If themal oxidation is chosen, it can use conventional steam or dry oxygen in a furnace, a rapid thermal heating in an oxidizing ambient, or any equivalent methods. Deposited oxides providing good conformality can also be used. For buried gates or buried wires, it is desired to have these conductors (yet to be formed) fully encased on the sides and bottom 207 with insulator. For other applications such as body contacts, the insulator in the bottom of the trench is not desirable 208, and for removing the bottom insulator section, a directional etching using fluorine-containing gases such $CF_4$ or $SF_6$ can be used in a directional mode to selectively etch the newly formed insulator (oxide) 205 from the horizontal bottom surface 208, leaving only the insulator along the trench vertical side walls.

Figure 2D:
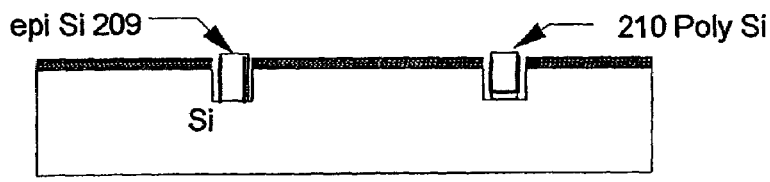

FIG. 2D shows that the trenches are then overfilled and planarized back to result in a selected conductor 209, 210 embedded in the trench. The conductor 210 can be selected from polysilicon, tungsten or molybdenum and alike for close thermal matching with silicon and stability at the follow-on high process temperatures. An epitaxial Si 209 process can also be used. In one preferred process polysilicon 210 is formed by depositing in an LPCVD reactor at about 600–700 C, using dichlorosilane and a dopant precursor such as phosphine.

The width of the gate pattern for the buried gates is restricted by the specific design ground rule. The polysilicon conductor 210 when deposited typically will fill and provide approximately a planar top surface. The polysilicon is then preferably chem-mech polished using, for example CABOT SC-I, a colloidal silica in an aqueous KOH solution with pH i10. Other polishing slurries commercially available and known in the field for polishing polysilicon with good selectivity to silicon nitride or silicon dioxide can also be used.

At the end of polishing, the polysilicon 210 in the trench may be slightly recessed with respect to the insulator 206 but has a high degree of smoothness, typically a few nanometers. Specifically, the polishing process described in the publication "Characterization of Polysilicon Oxides Thermally Grown and Deposited on the Polished Polysilicon Films", by Tan Fu Lei et al., IEEE Transactions on Electron Devices, vol. 45, No.4, April 1998, pages 912–917 is extremely attractive for producing a highly smooth polysilicon surface. The polish stop layer silicon nitride 203, if it was used, is now removed from the top horizontal surfaces by wet etching selective to silicon and silicon dioxide, as is well known in the art.

Figure 2E:
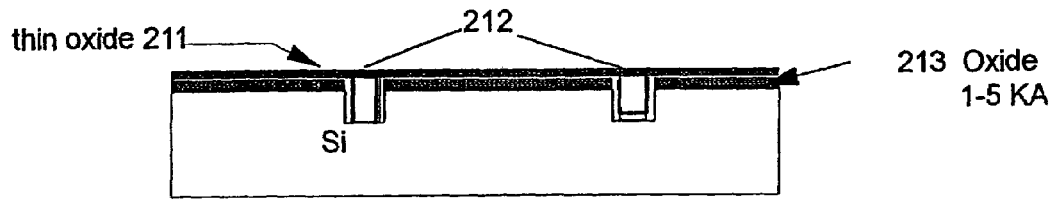

FIG. 2D represents approximately the appearance in cross section of the substrate after the polishing, with thermal oxide 200 on the top horizontal surfaces and polysilicon 210. All surfaces are then subjected to post CMP clean using a dilute 50:1 ammonia in a megasonic cleaner. An additional RCA clean process could be used. At this point the height differences between the polysilicon and the silicon substrate is typically less than 500 A Next, as shown in FIG. 2E, an oxide layer 211 of about 500–1000 A is formed over the polysilicon and remnants of thermal oxide layer 200. When 211 is formed by thermal oxidation, the thickness of oxide over doped polysilicon is expected to be somewhat thicker than the oxide growth in the surrounding Si areas. If thermal oxidation is used, 1000 A of oxide will consume about 400 A of polysilicon, whereas a slightly thinner oxide layer is formed over the silicon. The surface of the oxide is chem-mech polished using a stiff pad and suitable oxide slurry such as Cabot SC-1 so as to form a continuous and smooth oxide layer. If needed, other thinning processes such as etching can be used to compliment the polishing to achieve the desired oxide thickness over the polysilicon gate electrode. The process is typically designed to leave about 100–250 A of silicon dioxide 211 over the polysilicon gate.

Alternatively, a high quality CVD silicon dioxide of about 200–1000 A is deposited and polished back to leave a desired thinner oxide layer over the polysilicon gate region. Because of the method described above for the formation of the polysilicon in the trenches, the resulting structure shown in 2E will have a thinner oxide over the polysilicon gate region 212 and a thicker oxide 213 over the silicon substrate regions.

As a possible alternative, if CVD tungsten is used as the buried gate electrode. Instead of depositing polysilicon, a seed layer of TiN or Ti/TiN or TiW is deposited and followed by CVD W deposition using well established techniques with silane, hydrogen and $WF_6$ gases in a thermal reactor. The blanket metal film will appear similar to the polysilicon planar structure after deposition, which can be Chem-mech or plasma etched back to remove the W and the seed layers from the top surfaces. In one preferred process, the W layer will be recessed by using a plasma etch followed by forming a cap of silicide or silicon. The purpose of forming a tungsten silicide or polysilicon cap is again to form a thin oxide surface over the electrode. If a buried body contact is being formed, then there is no need to form the additional oxide on the surface of the encased conductor. Any oxide formed on the encased conductor is selectively removed. Other known variations of processes can be used to achieve essentially the structure shown in FIG. 2E with a variety of materials to form the components.

Figure 3A:
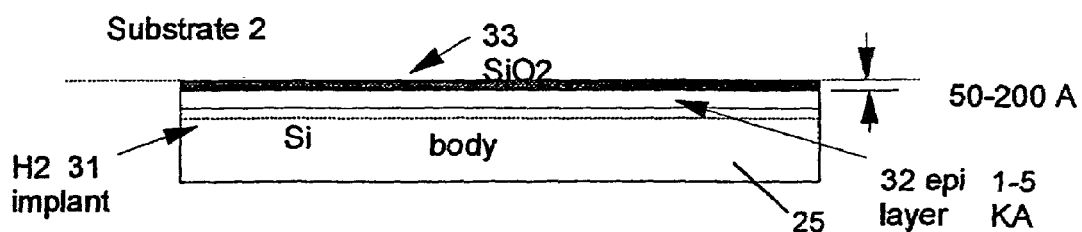
FIGS. 3A–3D illustrate the bonded SOI process for completing the process of FIGS. 2A–2E to form the device illustrated by FIG. 2.

Continuing with the bonded technique, FIG. 3A shows the development of the upper section 25. Substrate 30 is prepared to become a temporary carrier. First, as an optional but one preferred technique to facilitate the removal of excess wafer material after the lower section 23 and upper section 25 have been joined (reference FIG. 2), hydrogen is implanted 31 into the silicon substrate 30. Epitaxial layers 32 of silicon with different dopants from substrate or silicon-germanium may be deposited over the silicon substrate. Optionally, in the absence of a deposited epitaxial layer, the top surface region of the device susbtrate will become the device layer. The "Smart-Cut" process utilizing the epitaxially deposited layer is described in greater detail in U.S. Pat. No. 5,882,987, hereby incorporated by reference. The process of hydrogen implantation forms a silicon hydride layer 31 on suitable annealing, that becomes the basis of the Smart-Cut technique to allow separation of the unwanted layers of carrier wafer 30 after the top section 25 is bonded to the bottom section 23. Although Smart-Cut is the exemplary process for transferring the device layer 32, alternate processes of combining etching and polishing, such as those described in U.S. Pat. Nos. 4,601,779 and 4,735,679, can also be used.

Figure 3B:
Figure 3C:
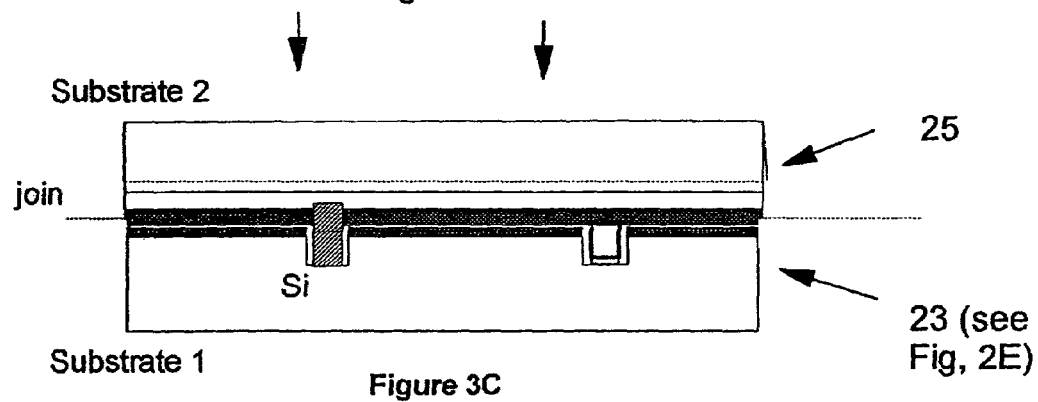
Figure 3D:
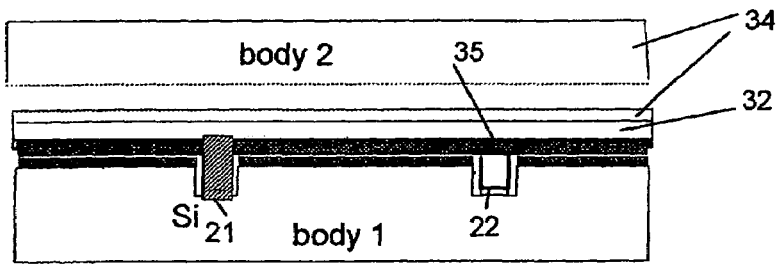

Device layer 32 is deposited epitaxially using, for example, SiGe, but the specific material depends upon the device to be fabricated. An etch stop layer is optionally added on top of the device layer, which could be simply a highly doped silicon layer or a silicon-germanium layer, as per the teaching of the above mentioned U.S. Pat. No. '987. A thin thermal oxide 33 of thickness 50–200 A is optionally grown on the monocrystalline surface. When the end device will include body contact, a bare silicon without oxide layer 33 is used. Hydrogen 31 is implanted under conditions taught in '987, preferably at a depth below the deposited device layer. As shown in FIGS. 3B and 3C, the device wafer 25 is then flipped and attached to the carrier substrate 23 prepared in FIGS. 2A–2E. By way of exemplary technique, the oxide surfaces are joined using surface treatments to make oxide surfaces 33,211 hydrophilic. Such attached wafers have sufficient bonding to withstand most handling. The wafers are now heated at about 300–600 C to complete the Smart-Cut process as shown in FIG. 3D, in which the excess wafer section 34 is then removed. In one variation of the Smart-Cut process, the wafer is heated to a temperature range 250–400 C to segregate hydrogen to the device layer interface (in the case of SiGe deposited layer), followed by cleaving the substrate 34 along the hydrogen implanted surface using water jets.

The transferred device layer surface 35 is now finished to a smooth surface by polishing or etching or along the teaching of U.S. Pat. No. '987 using an optional etch-stop layer Thus, an SOI wafer 20 (see also FIG. 2) with buried body contact 21 and buried gate electrode 22 has now been formed. The gate oxide 36 on the buried gate electrode is roughly equal to the thickness of oxide 33 or to the sum of the two surface oxides 33, 211, and can be between 100–500 A, depending upon the selection of thickness of individual oxide layers. As discussed earlier, one of the oxide layers 33 can also be conveniently not formed since bare Si surface can also be effectively bonded to silicon dioxide. As discussed in the IEEE publication mentioned above, the polyoxide formed over polished polysilicon, either thermally formed or deposited, is very high quality, approaching that required for gate oxide applications.

Referring now back to FIG. 2 showing the completed SOI structure, top gate electrodes 214, 215 are formed on top of a gate oxide layer 216. To achieve this, typically a polysilicon layer deposited on top of the top gate insulator is patterned to create top gate electrodes 214, 215. The device layer 25 is now the channel or body layer for both the top gates 214, 215 and bottom gate structures 21,22. The top gate electrodes 214, 215 could be a polycide layer if the application would require a lower resistance.

Figure 4A:
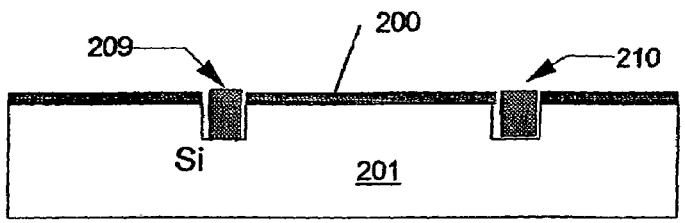
FIGS. 4A–4E show an exemplary set of steps using the SIMOX process for a device illustrated by FIG. 2.
Figure 4B:
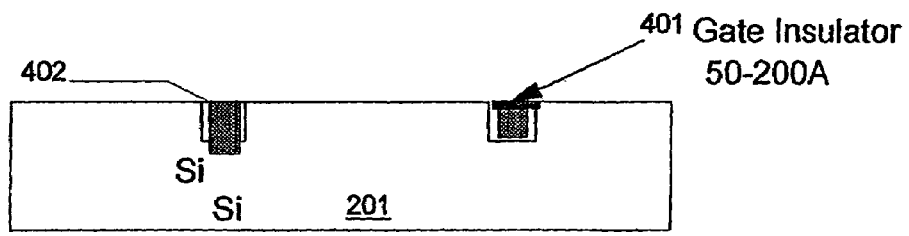
Figure 4C:
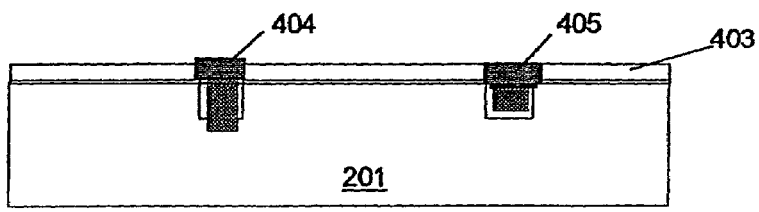

FIGS. 4A–4E illustrate an alternate formation using the SIMOX process of a corresponding buried contact and buried gate electrode structure. The process steps to create the buried structures 209, 210 is same as used in FIGS. 2A–2D. Thus, FIG. 4A starts as being the same structure shown in FIG. 2D with trench/sidewall/conductor 209 and trench/sidewall/bottom/conductor 210 structures filled with doped polysilicon or other suitable refractory conductor material. Polysilicon will arbitrarily be assumed here as the conductor. FIG. 4B shows surface insulator 200 having been removed and gate insulator 401 having thickness of 50–200 angstroms being formed over the electrode 210 to be used a buried gate. In a preferred process, this gate insulator 401 is formed by oxidizing the polysilicon with the oxide insulator 200 still in place and then the insulator 200 is removed by a polish or etch process. In one preferred embodiment of this polysilicon oxidation process, the insulator 200 has an additional SiN layer to allow only the polysilicon to be exposed and thereby oxidized in a controlled manner.

Figure 4D:
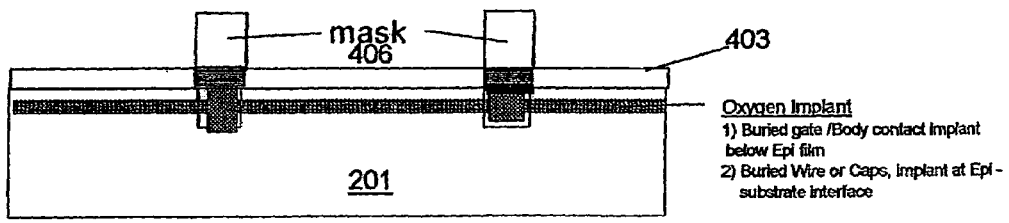

Thereafter, oxide layer 200 is removed and any insulating layer 402 over the buried contact 209 is selectively removed by means of a block-out mask (FIG. 4B). A device layer 403 is deposited under epitaxial condition, which forms a single crystal over the all silicon surface (FIG. 4C), except that small regions of polycrystalline Si 404, 405 are formed over polysilicon and oxide surfaces. The regions 404 and 405 can be formed single crystalline if epitaxial conditions for lateral growth can be used, such as taught in U.S. Pat. No. 5,646,958, the contents of which are incorporated herein by reference. In FIG. 4D an implantation mask 406 is formed over the buried regions and oxygen ions 407 are implanted into substrate 201, using typical SIMOX conditions such as taught in U.S. Pat. No. 6,043,166, the contents of which are incorporated herein by reference.

The energetics of the implantation controls the depth of the implanted ions 407. For a buried gate 210 or body contact 209, the implant depth is chosen to be slightly beneath the device layer. For buried wires and capacitors, since the structures are fully encased in insulator, this implantation location is less critical but preferably the implant depth is chosen to be near the device layer and substrate interface so that at least part of the BOX layer formed can cover the top of the wire and capacitor elements.

Figure 4E:
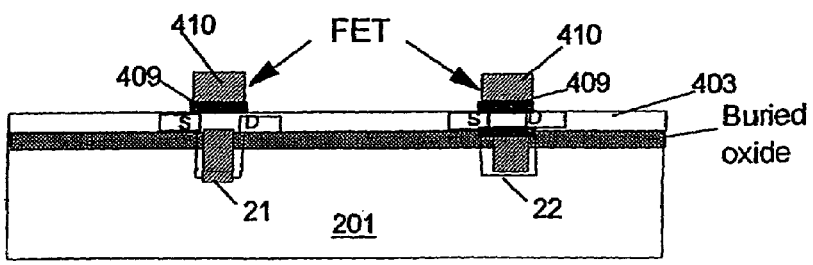

Using anneal conditions and timing such as taught in U.S. Pat. No. 6,043,166, the implanted oxygen is converted into a buried oxide layer 408 as shown in FIG. 4E. Transistors are formed with gate oxide 409 and gate electrodes 410 using standard masking and deposition techniques to result in the structure similar to that shown in FIG. 2.

Even though the SIMOX process has been described using a set of preferred process steps with a view to forming buried gate electrode and buried body contact elements, it should be obvious to one skilled in the art, the above described process steps can be used as well to form other elements such as buried wiring layer or capacitor elements by small variations to the above process.

FIGS. 5A–5D show a magnified view of three exemplary SOI structures, buried gate electrode 50A (FIG. 5A), body contact 50C (FIG. 5C),and buried wire 50D (5D), for purpose of demonstrating additional advantages of the invention.

Figure 5B:
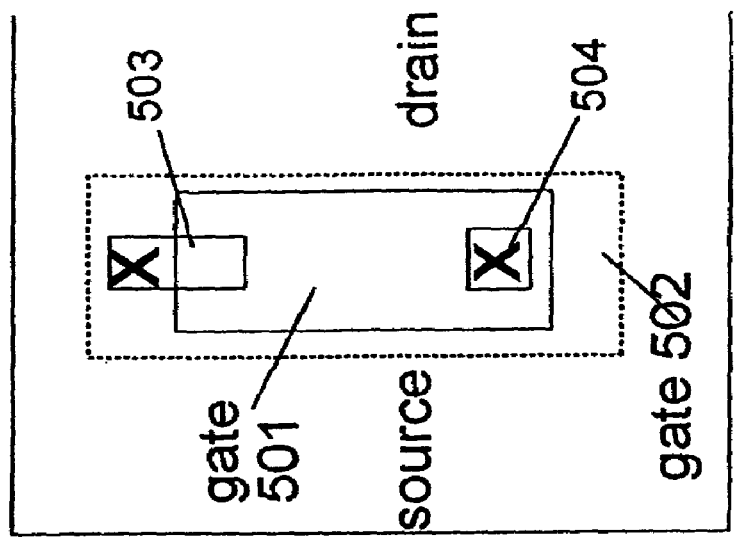
FIGS. 5A–5D illustrate examples of different device elements formed using the invention that illustrate advantages of the invention.
Figure 5A:
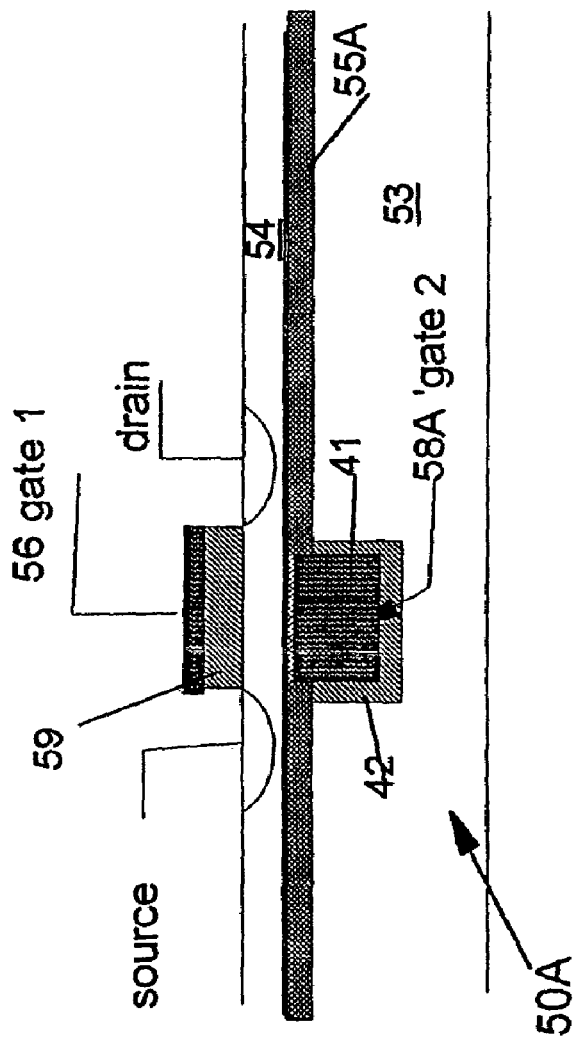

FIG. 5A shows the resultant structure 50A when the lower section 53 and upper section 54 are formed so as to result in a buried gate electrode 58A. Of particular interest in this structure 50A, and which differs from the prior art, is that the buried oxide (BOX) layer 55A is now an integral part of the second gate device 58A. Specifically, the SOI buried oxide layer 55A acts as the second gate insulator for the buried FET and also as isolation of the device layer 54 from the substrate 53.

Also of interest in the FIG. 5A structure 50A is that the buried oxide layer 55A forming the second gate insulator will generally be a different thickness than the upper oxide layer 59 forming the upper gate insulator structure. This different thickness can be a useful technique for controlling the dual gated device characteristics.

FIG. 5B shows an example of a top view of the dual gates layout. The effective shapes 501, 502 of the two gates 56 and 58A can have different length, width or shapes to facilitate easier contact to respective gates or to obtain a device of different channel lengths so that a dual gate and single gate channel regions can be combined in parallel to achieve different gains. The top and bottom gates 56, 58A can be positioned to small variations such as different angles (bent gates) to facilitate for example, better lay out of wiring tracks on the top or easier contact to bottom.

FIGS. 5A and 5B also show the technique of connecting the upper and lower gates 501, 502 by vias 503, 504 so that when the gate voltage is impressed on the top, it acts on both top and bottom, improving the device performance. In the inventive process, this connection can be achieved using a simple process of using two layers of polysilicon for the top gate electrode, such as described in U.S. Pat. No. 4,341,009, which is incorporated herein by reference. Using this referenced process, formation of the via 503 and 504 is straightforward. '009 describes a process using dual polysilicon to form buried contacts. First a thin layer of polysilicon or polycide is deposited on the gate oxide, followed by etching a contact hole through the thin electrode, gate oxide and body channel layer, and buried gate oxide to the buried gate electrode. A second gate electrode layer is now deposited and patterned to make the first and second electrode contact. During this process, it is also possible to make other connections such as body contact, as additional contact can be made to the carrier substrate. This technique is used here where the gate electrode is formed in two steps. In step 1, a first polysilicon layer is blanket deposited over the gate oxide in forming the top device, followed by etching the via. A second polysilicon layer now is deposited on the first polysilicon which makes the contact to the body layer or bottom electrode while providing additional thickness to the top gate electrode. This stack is now patterned to include top gate electrode and the via connection. A more tradional process step can be used whereby the top electrode is formed, via 403 or 404 is etched in a separate step and a local interconnect or a contact stud metallization used to connect the top and bottom electrodes.

Figure 5C:
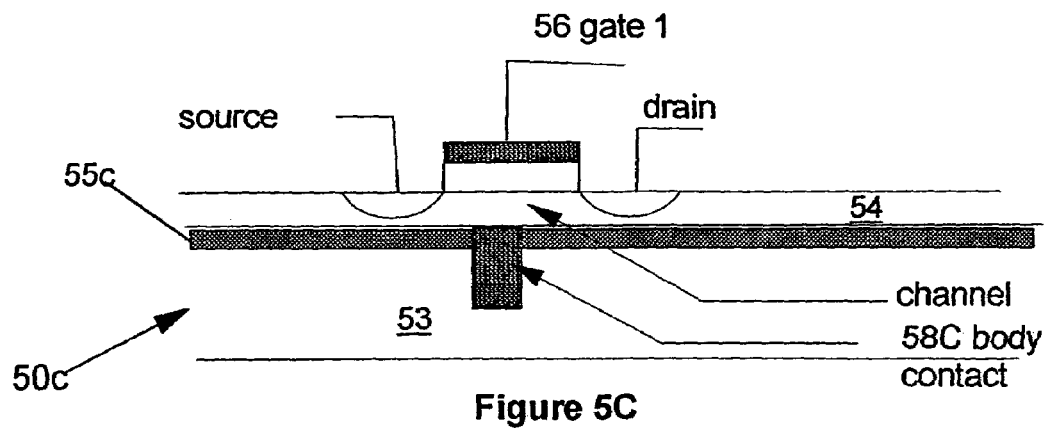

In SOI devices, there is a strong need to connect the body silicon region to a common ground or substrate potential to stabilize the threshold voltage. FIG. 5C shows one such structure 50C having device layer 54, BOX layer 55C, and substrate 53. Region 58C which is a polysilicon electrode that contacts directly the device layer 54 at the body region of the gate 56. Forming such a polysilicon electrode has been discussed already relative to FIGS. 2–4. This preferred embodiment provides a required body contact with no additional space needs, without any need for additional photo process, layer depositions, etc. This embodiment therefore represents an attractive process for forming an SOI buried contact.

Figure 5D:
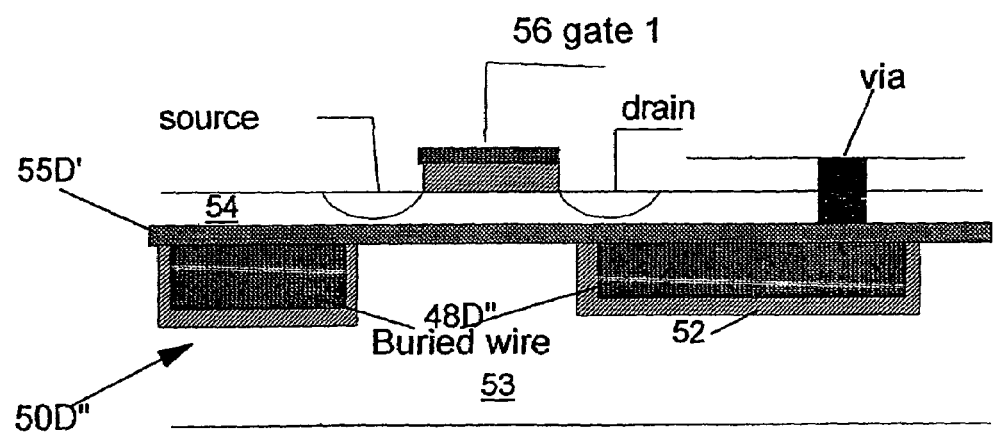

FIG. 5D shows a buried wire 52, which can be used for making local interconnect between a contact of a transistor to an adjacent transistor or to a resistor or capacitor. For schematic simplicity one via contact is shown extending a via from a buried wire to the top surface above the device layer. In typical applications multiple vias are provided from the same buried wire which can be used to connect devices at the top surface. Since the buried wire layer 52 is at a different plane than the devices, wirability is easily achieved, wihtout concenrning of crossing over other devices or other connections on the top surface.

One of the important features of this invention is the ability to use the SOI buried layer to form separate devices while still retaining a commonality between the devices. This feature allows devices to be interconnected without having to provide interconnection conductors, thereby improving device density. This feature is exemplarily illustrated in FIG. 6A and FIG. 6B for the case of forming separate FETs 61, 62 sharing a common body layer 64. Additional specific examples will be discussed later and many more should be obvious to one of ordinary skill in the art, but the examples in FIGS. 6A, 6B will demonstrate the important concept that entire circuits can be more effectively fabricated by considering the BOX as an important component at not only the device level but also at the circuit level, as will be discussed in more detail shortly.

Figure 6A:
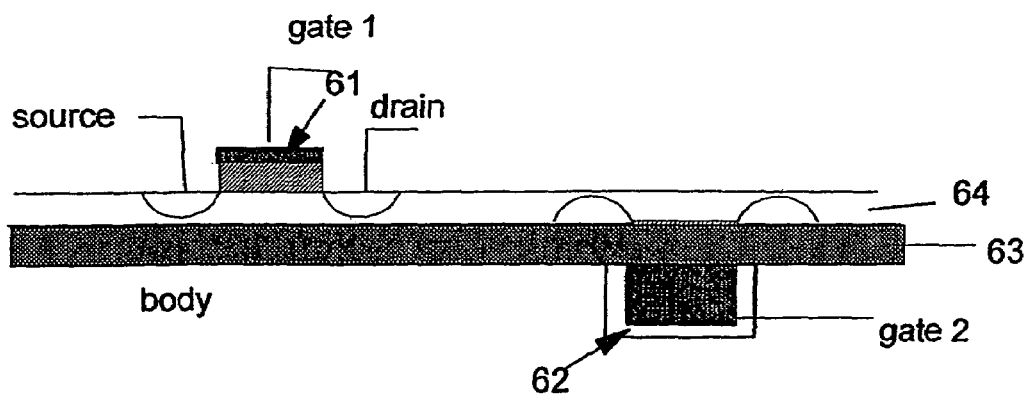
FIGS. 6A–6C illustrate an advantage of the invention of using the BOX to interconnect components without having to use connectors.

In FIG. 6A is shown the general case of two devices 61 and 62 isolated by SOI buried layer 63 and sharing a common body layer 64. This feature enables formation of many more FETs, with each layer of FET design being optimized by separate layout restraints. As discussed earlier, buried electrodes and body contacts can be advantageously used to interconnect these devices to form circuits. When the buried gate 62 is laterally separated from the top gate, the source/drain regions for the buried gate can be formed by patterning dummy gates over the buried gate as a masking layer and implanting selective regions to complete the buried FET device.

Figure 6B:
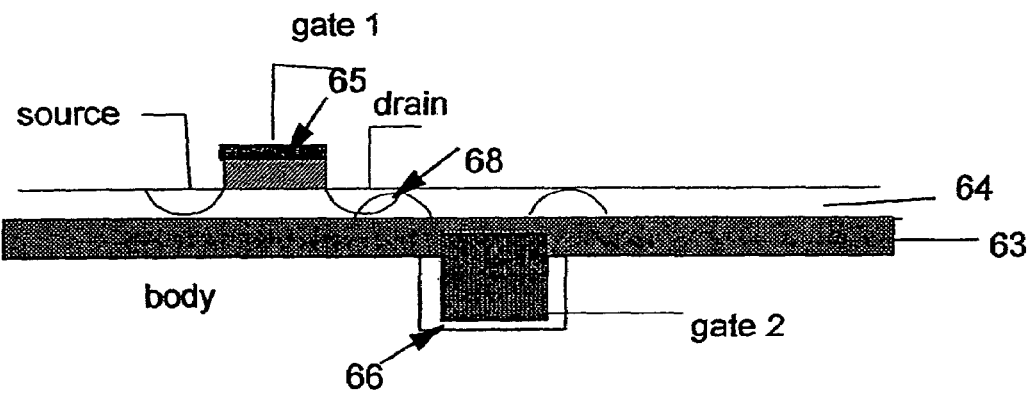

For many applications, the source/drain of adjacent devices can be advantageously shared, as shown in FIG. 6B, to provide specific circuit interconnections. This technique increases the density of device layout since this configuration becomes a series connection at node 68 between FETs 65, 66 without having to use additional interconnectors. It should be obvious that parallel connections are similarly possible.

Figure 6C:
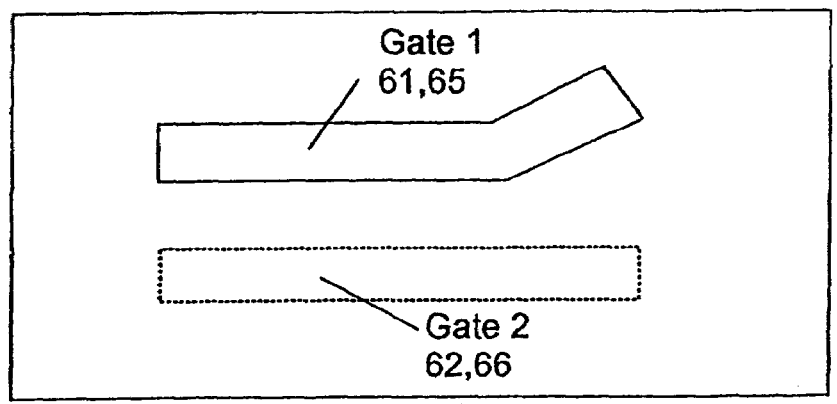

FIG. 6C illustrates the degree of freedom in the layout of the top electrodes 61,66 and bottom electrodes 62,65 resulting from this invention. For example, one or both of the gates can have bends in order to meet other requirements or provide other advantges such as ease of wirability.

Figure 7A:
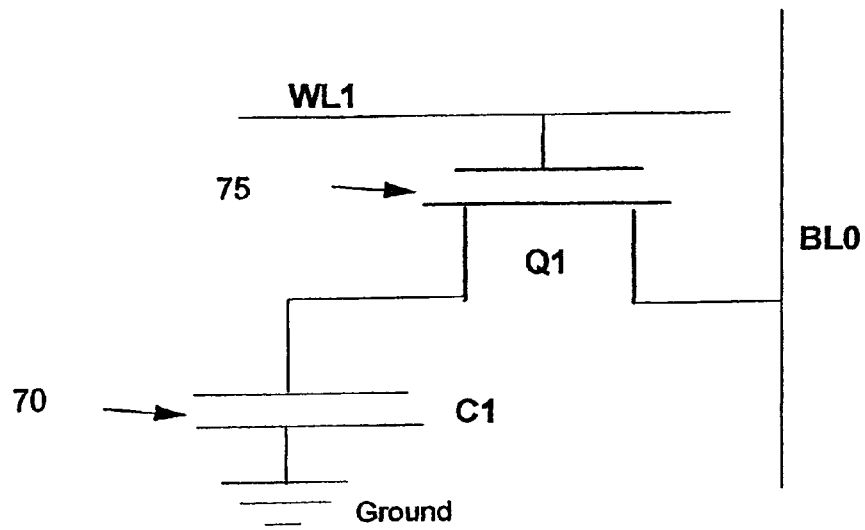
FIGS. 7A–7B illustrate another example of the invention, as used to implement DRAM cells.
Figure 7B:
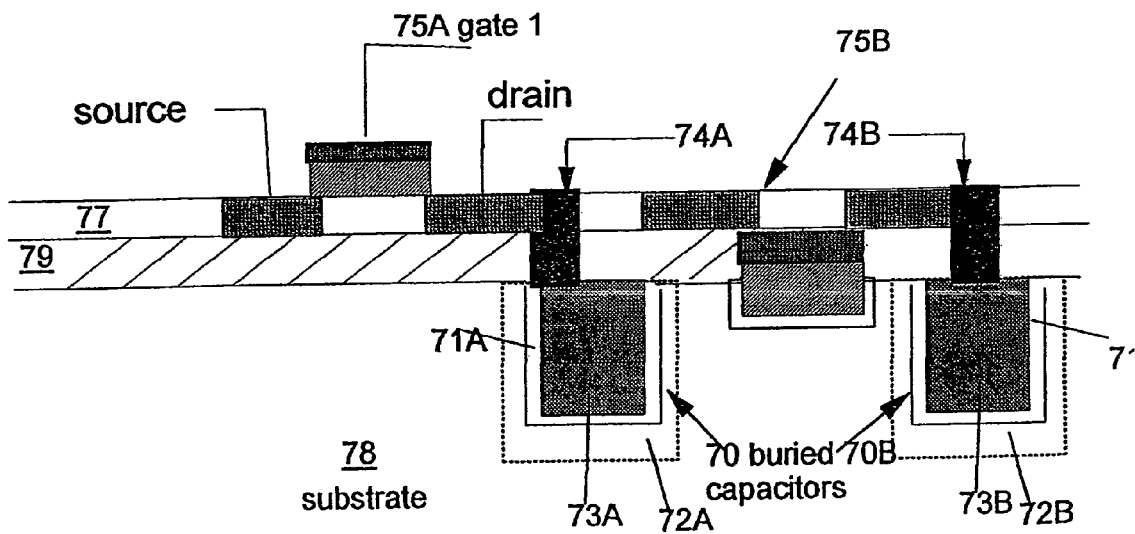

FIG. 7A illustrates a schematic of a conventional DRAM cell using a single FET 75 and a single capacitor 70. One electrode of the capacitor is connected to the drain region of the FET 75 and the other electrode is grounded. FIG. 7B shows the SOI device embodying two of these DRAM cells and taking advantage of the invention, the first using a top gate FET 75A and the second a buried gate FET 75B. Buried capacitors 70A, 70B are formed in the substrate 78 and top gate for 75A and buried gate for 75B are connected to the capacitors using vias 74A, 74B. The structure of FIG. 7b is formed by the combination of substrate 78 with a device layer 77 through an intermediate BOX layer 79. Various possible processes that can be used to form these structures have been described already with the aid of FIGS. 2–4.

The formation of capacitors 70A, 70B in a substrate, for example, has been specifically discussed with the aid of FIGS. 2A–2D. The buried conductor 73A, 73B with the right choice of trench dimensions and capacitor node dielectric 71A, 71B (oxide or oxide/nitride formed on the trench walls) will determine the capacitance value of the buried capacitors. The capacitor ground electrodes can be formed either by use of a highly doped substrate 78, or by diffusion drive-in of dopants to form a highly doped external regions 72A, 72B in the substrate along the perimeter of the capacitors 70A, 70B prior to forming the node insulator. This step and additional process steps for forming such a structure is known and described in U.S. Pat. No. 5,770,484, which contents are herein incorporated.

In contrast to processes where the buried capacitor is formed subsequent to the SOI substrate, the process described here, where the buried capacitor was formed prior to the SOI structure, offers process simplicity in comparison with other SOI trench capacitor processes and can provide better yields and lower cost.

Figure 8A:
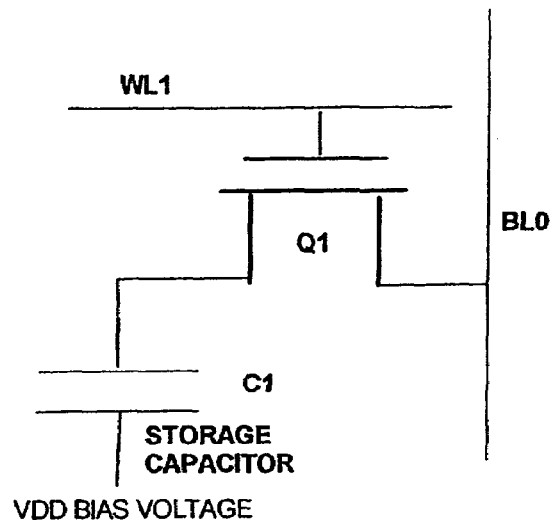
FIGS. 8A–8C illustrate a second implementation of DRAM cells using the invention.
Figure 8B:
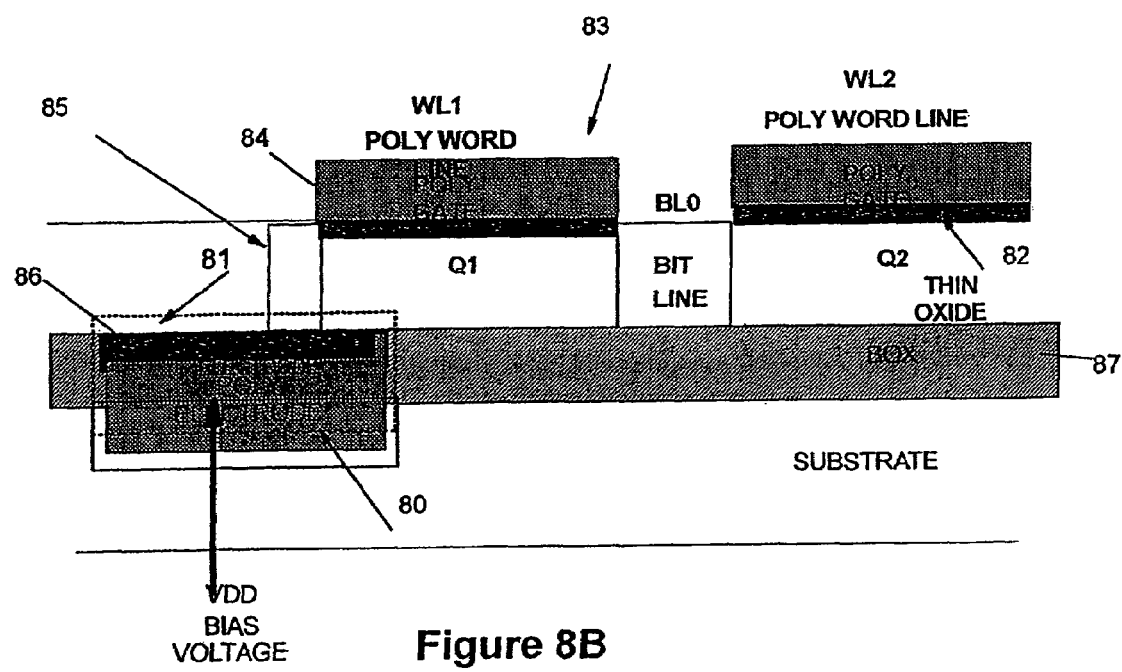
Figure 8C:
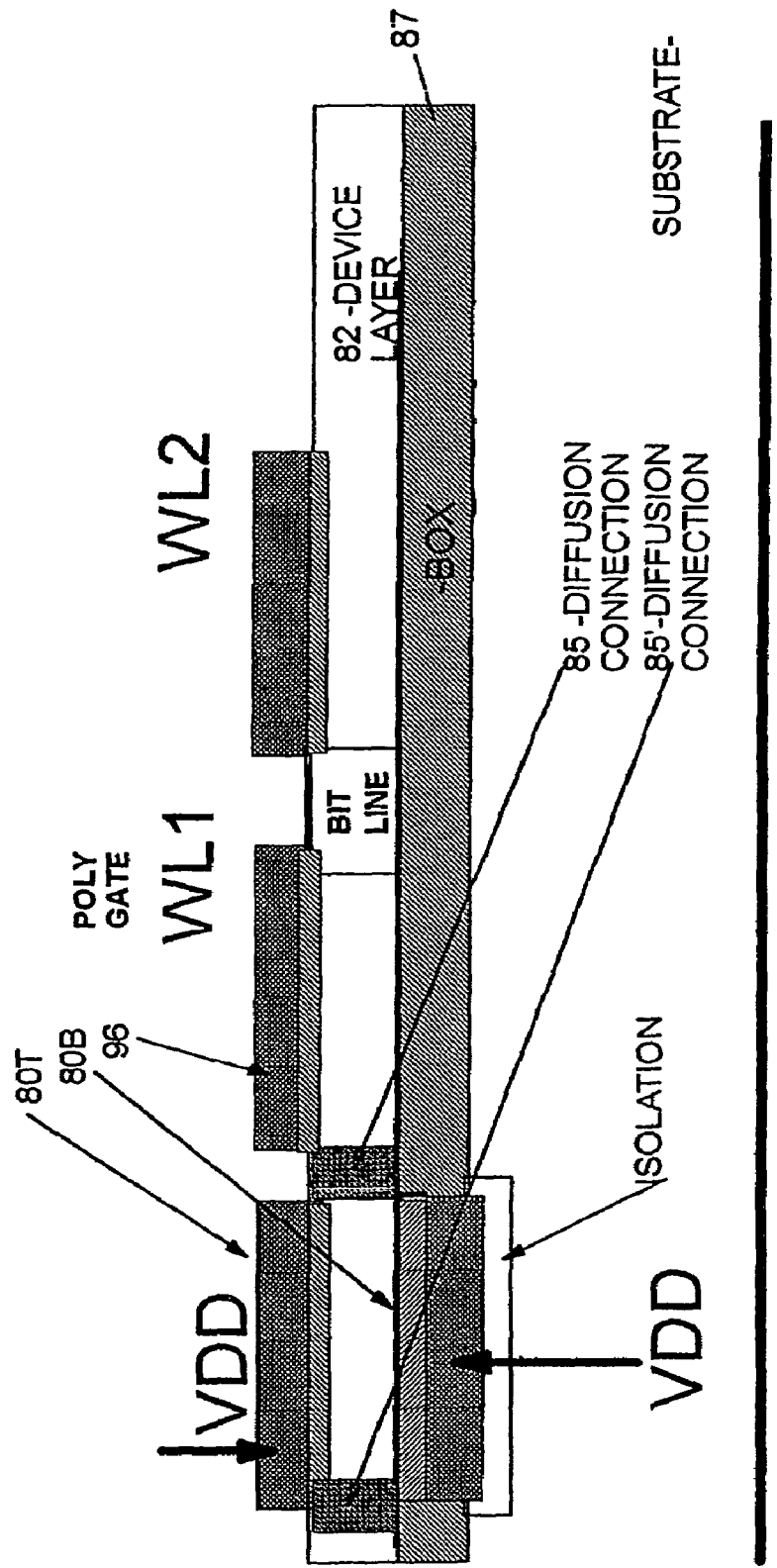

FIGS. 8A–8C show a variation of the DRAM cells discussed in FIGS. 7A–7B. FIG. 8A is a well known prior art schematic diagram of a single device storage capacitor circuit which uses a single transistor Q1 and a storage capacitor C1. Use of depletion capacitors are well known in the art (see for example U.S. Pat. Nos. 4,163,243 and 4,259,729). The gate of Q1 is activated by a high voltage to turn Q1 on, thus allowing the data signal level on bit-line BL0 to be transferred to the capacitor C1. The schematic shown in FIG. 8A is similar to the schematic in FIG. 7A, except that the capacitor node labeled VDD was at ground potential. FIG. 8B illustrates one embodiment of using a single depleted capacitor 80 utilizing a positive bias voltage impressed on the buried electrode to create an accumulation region 81 (counter electrode) in the device layer 82. An important novelty of this circuit application is in the physical arrangement of the transistor Q1 (83) located on the top of the common shared semiconductor region 82 and the capacitor C1 (80) located on the bottom side of that same shared region. This structure is made possible by the semiconductor teaching of this invention. FIG. 8B will be further described in the following paragraph but it should be explained that a multiple variations on this scheme are easily visualized.

In the embodiment of FIG. 8B the data bit to be stored is presented to the cell on bit line BL0. Transistor 83 (Q1) is activated, as previously stated, by a high signal applied to its gate 84, thus allowing the voltage level of BL0 to be transferred to capacitor 80 (C1). As is well known in the art, the DRAM cell is read out by preconditioning BL0 to a predetermined voltage level that is between a logical 1 high and a logical 0 low voltage level. Bit line BL0 is connected to a sense amplifier (not shown) which will differentially sense the voltage between BL0 and a reference voltage. A high voltage is applied to WL1 the gate of transistor Q1 . This turns Q1 on and the signal stored on capacitor C1 will be transferred to BL0. This signal will be very small compared to the signal that was originally written into the cell using BL0. The sense bit line BL0 will be disturbed electrically in either the positive voltage direction or negative voltage direction from its predetermined intermediate level depending on the state stored in capacitor C1. The sense amplifier attached to BL0 will sense and amplify this small voltage disturbance.

FIG. 8B shows that one side of capacitor C1 is connected via a diffusion 85 to transistor Q1. The other electrode of C1 is a plate formed with polysilicon electrode of capacitor 80. The insulator 86 overlying the electrode of capacitor 80 (C1) is the capacitor dielectric. This dielectic could be the same or similar material $SiO_2$ as in BOX layer 87. It could also be a different material such as a high dielectric material allowing a larger value of capacitance for C1 using the same plate area as this material can be formed during the formation of the buried capacitor electrode by deposition.

The arrangement of electrodes of capacitor becomes clear by comparing FIG. 8A and 8B. The diffusion region 85 connects the top electrode of the capacitor C1, to a plate-like region formed by inducing charge on the top surface of the thin dielectric 86 (oxide or high dielectric material) by applying a positive potential to the lower plate of C1. The positive potential causes negative carriers to be attracted to the top side of C1 making it conductive and forming the top plate The bottom plate of the capacitor is simply the buried electrode of capacitor 80.

One aspect of novelty in this structure is the location of C1 horizontally relative to Q1. C1 may be located substantially under Q1 which produces a minimum total cell area, allowing maximum DRAM memory density on a unit area of silicon wafer. It may, however, be located substantially outside the region covered by the gate of Q1 for a minimum density result and still operate. The point is that the location of C1 relative to Q1 is non critical, so long as C1 does not come closer to bit line BL0 than some minimum dimension established by a leakage current/storage cell retention time criteria.

FIG. 8C is an extension of FIG. 8B, wherein the capacitor is provided by forming the structures 80B and 80T, where 80T is now formed on top of the device layer 82. The advantage of this is that the area of capacitor 80 can be cut in half allowing for greater overall packing density. In addition to using high dielectric constant insulators for the capacitors, one can also use roughened surface electrodes to increase the capacitor electrode area. Both these techniques are well known in the art. Additional variations of structure and materials are possible within the general concepts of forming buried structures taught in here.

Figure 9A:
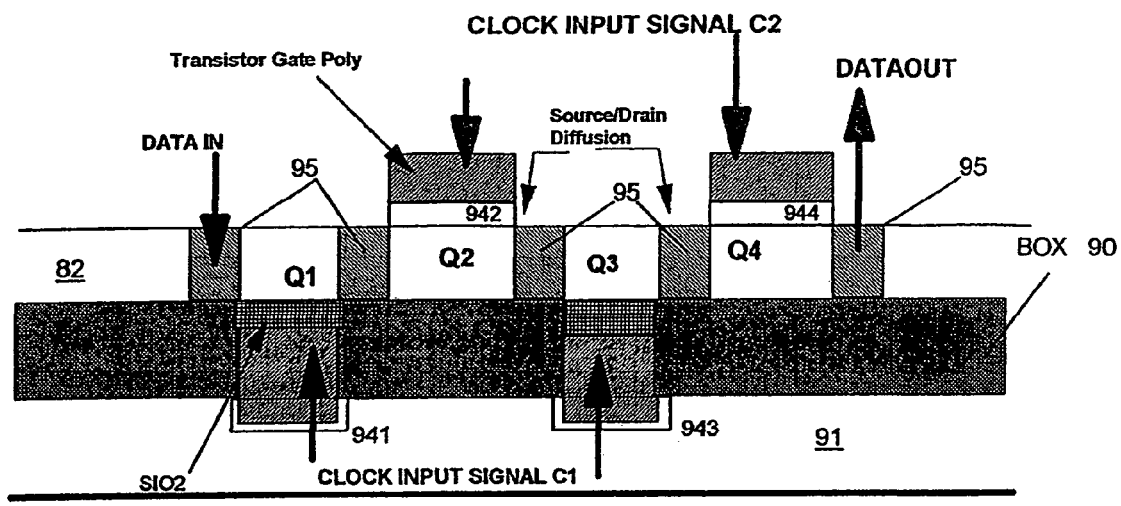
FIGS. 9A–9C illustrate an example of the invention for a dynamic two phase shift register circuit, which example demonstrates the BOX as a circuit element.
Figure 9B:
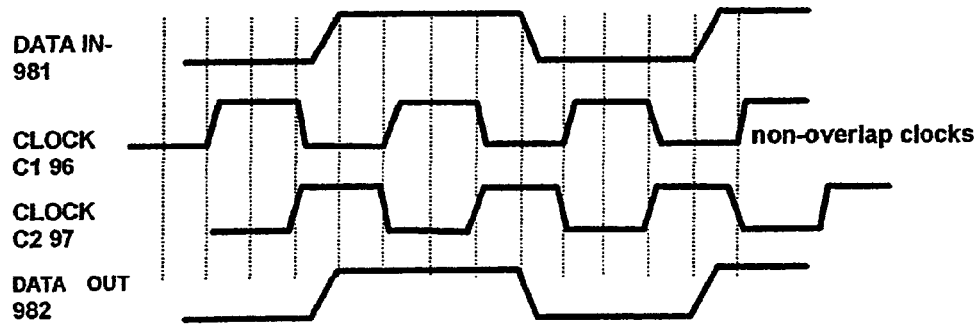
Figure 9C:
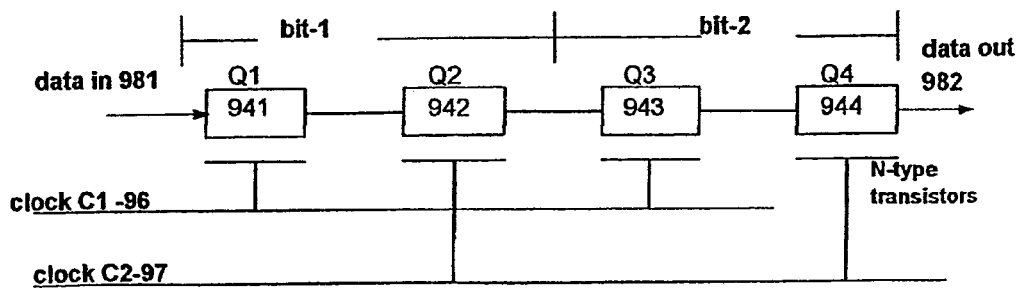

FIGS. 9A–9C illustrate an application of building and operation of a dynamic two phase shift register using the invented structure. FIG. 9A shows a conceptual vertical structure utilizing the semiconductor processing teaching of this invention to construct four N-type transistors that is connected as per the Figure C schematic to provide a two phase dynamic shift register with the FIG. 9B timing diagram. These dynamic shift registers have been a classical circuit technique to store data.

FIG. 9A shows the cross section of one possible SOI structure created by a substrate 91, a device layer 92, and an oxide layer 90 separating the two. Further, along the teachings of this invention, two buried gate transistors 941 and 943 are formed in the substrate region 91. Two top surface FETs 942, 944 are formed using additional process steps on the device layer. All the FETs are N-type, as determined by the choice of dopants in the device layer and Source/Drain regions, and all sharing the same body layer 92. By use of overlapping source and drain regions 95 between adjacent FETs, the series connection of the transistors as in FIG. 9C is achieved without a need for any external wiring.

In a two phase dynamic shift register two transistors are used to store one bit of data. In the case of FIG. 9C, transistor 941 and 942 together store bit 1 and transistors 943 and 944 store bit 2. Referring to FIG. 9B, clock C1 signal 96 is applied to the gate of transistors 941, 943, and clock C2 signal 97 is applied to wire connected to gates of transistors 942, 944. The data bit is actually stored on the parasitic capacitance of the circuit, such as the diffusion capacitance. Two clock signals 96, 97 are used to control the shifting of the data from one bit location to the next. One bit is shifted one position by applying clock signal C1 (a high) followed by clock signal C2 (a high). The clocks are non-overlapping meaning that C1 and C2 are never both high at the same time. Eventually the data entered into the shift register is attenuated and lost after some number of shift positions unless it is restored in amplitude by a gain stage. Variations of the two phase shift registers can be constructed with more transistors than shown in FIG. 9A so as to restore or amplify the data at each bit position in the serial string. The circuits for shift registering and amplification are known in the art and the novel aspect of the present invention is the two phase shift register structure shown in FIG. 9A, which provide space saving and greater density.

The two phase shift register structure of this invention register is based upon the very important semiconductor processing teaching of this invention that allows transistors to be isolated by BOX layer 90 to be formed on top and in bottom of a shared region 92 of semiconducting material.

In the structure shown in FIG. 9A the transistors do not lie one above another but are staggered such that the source of one transistor is shared with the drain of a second transistor, an embodiment earlier discussed with FIG. 6B. As can be readily seen, one of the novelties in FIG. 9A is that the two transistors of this invention 941 and 942, unlike prior art, do not reside on the same vertical level, typically both on top. In this invention, one of the transistor 941 (Q1) is in the bottom, and the next transistor 942 (Q2) is on the top. The wiring of the clock signal C1 to the gate of Q1 takes place below the common layer 92 structure, at least in part, where it is necessary to connect to gate region, i.e., via polysilicon. Similarly, the corresponding wiring to Q2 takes place above the common layer 92 structure providing a means to connect clock signal C2 to the gate region of transistor Q2. In this manner the necessary wiring to gates on either the top side or the bottom side is substantially reduced in utilization of available real-estate on any one side.

Further, if geometries of the transistors, diffusions, and gate wiring were such that a conflict for available real-estate existed when attempting to wire the gate regions of two sequential transistors in the shift register chain, such conflict would be substantially reduced or eliminated by constructing the shift register in an alternating fashion of top/bottom transistor location as shown in FIG. 9A. The circuit chosen to demonstrate this concept is the two phase dynamic shift register because it is a well known application of classical MOSFET function. However other circuit applications would obviously benefit equally well with reduced gate wireability congestion thus allowing for improved device/ circuit density.

Figure 10A:
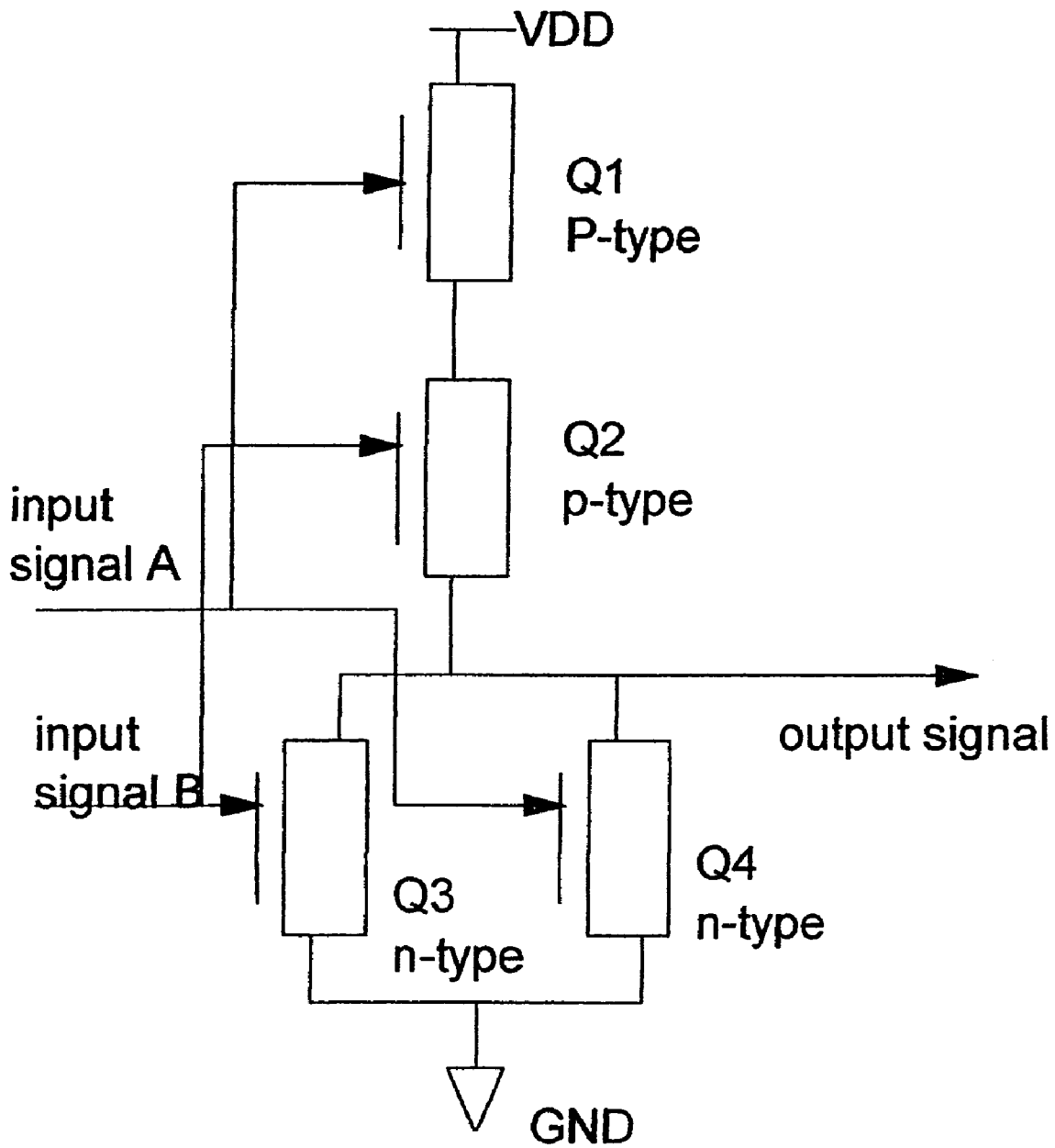
FIGS. 10A–10B illustrate the invention used for a NOR circuit.
Figure 10B:
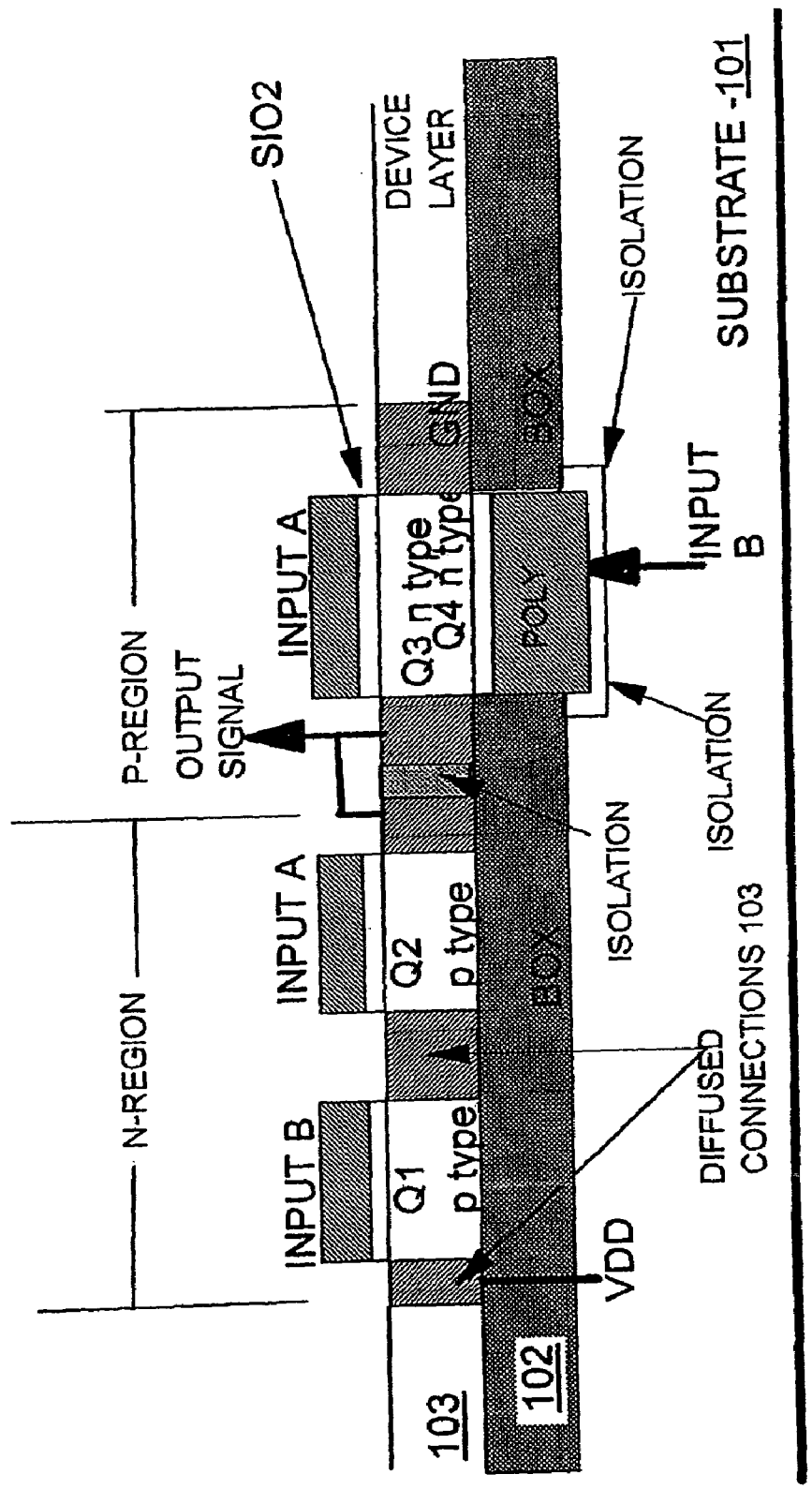

FIG. 10A and 10B show the application of the subject disclosure to a CMOS NOR logic circuit. The FIG. 10A schematic shows a two-way logical NOR circuit. Input signals A & B are connected to the gates of transistors Q2 & Q4 and Q1 & Q3, respectively. Transistors Q1 and Q2 are P-type transistors and transistors Q3 and Q4 are N-type. This schematic is well known and one of the most widely used logic circuits. The other widely used CMOS circuits are the NAND and the simple inverter circuit, and the implementation of the invention into these well known circuits would be obvious to one of ordinary skill in the art.

The structure of the NOR circuit in FIG. 10B represents a vertical cross-section of a semiconductor chip utilizing the subject invention. A substrate 101 and a device layer 103 are separated by a BOX layer 102. The transistor Q4 is formed within the substrate (buried) using the process steps taught in the preferred embodiments. The transistors Q1, Q2 and Q3 are formed on the device layer using conventional processes of oxidation, gate electrode deposition, patterning etc. The scale of the semiconductor geometry is simplified here to assist the understanding of how the NOR circuit of FIG. 10A is realized. The most dramatic benefit and novel benefit apparent in FIG. 10B is seen in the location of transistor Q3 directly above transistor Q4. It should be noted that transistors Q1 and Q2 are constructed on the same horizontal axis. Since the transistors Q1, Q2 are P-type and Q3 and Q4 are N-type, the device layer has isolation regions to separate the different dopants in the device layer corresponding N-type and P-type regions. The current industry practice is to have the placement or physical location of all transistors on the same horizontal plane.

However, this invention allows a unique means to fabricate transistor Q3, Q4, one above the other, thus allowing for a significant reduction in chip size for a given logical function. It should be noted that this is the technique discussed earlier in which components are connected in parallel without requiring separate interconnection conductors.

Additional benefit will be apparent in this structure in the area required for the commonly shared source drain diffusions shared by transistors Q3, Q4. In particular the area of the common drain diffusion of Q3 and Q4 shared with the source diffusion of Q2 is reduced in area such that the switching time on the NOR circuit is significantly reduced. This common node or diffusion also serves as the output node of the circuit. Since any capacitance reduction results in a reduced circuit delay (switching time), the speed is additionally increased. The concept here is shown for a NOR circuit but is also readily applied to the popular NAND logic circuit and many other circuit types found in the current CMOS logic technology industry that produces today's microprocessor chips and ASIC custom chips.

These are but some examples of circuits that can be formed utilizing buried devices in conjunction with traditional FETs and other devices. Many ASIC applications can benefit with the additional design ground rules allowed by the inventive devices being available in the buried substrate.

The examples discussed also demonstrate that with these techniques the buried oxide can be used for more than simple isolation. The BOX has been shown to be available for other functions such as the gate oxide for a buried transistor and the pass-through for a body contact.

While the invention has been described in terms of preferred embodiments, those skilled in the art will recognize that the invention can be practiced with modification within the spirit and scope of the appended claims.

What is claimed is:

1. An electronic circuit provided in a semiconductor-on-insulator (SOI) substrate, comprising:
a plurality of interconnected field effect transistors (FETs) having elements disposed in a device layer overlying a buried oxide layer of the SOI substrate, wherein at least one of the interconnected FETs includes a portion of the buried oxide layer as a functional element integral to its operation, wherein the electronic curcuit comprises a complementary metal oxide semiconductor (CMOS) NOR circuit.

2. The electronic circuit of claim 1, wherein the CMOS NOR circuit is provided on a semiconductor-on-insulator (SOI) substrate having a buried oxide layer and a device layer disposed above the buried oxide layer, the CMOS NOR circuit comprising:
a first p-type field effect transistor (PFET) and a second PFET connected in series, the first and second PFETs each having a source terminal, a drain terminal and a gate terminal, wherein the source terminal of the first PFET is coupled to receive a supply voltage;
a first n-type field effect transistor (NFET) and a second NFET connected in parallel, the first and second NFETs having a common drain terminal and a common source terminal, wherein the common source terminal of the first and second NFETs is coupled for providing a connection to ground.
wherein the drain terminal of the second PFET is connected to the common drain terminal of the first and second NFETs, and the gate electrodes of the first and second NFETs are disposed on opposite sides of the buried oxide layer.

3. The electronic circuit of claim 2, wherein the gate electrodes of the first PFET and the second NFET are coupled to receive a first input signal, the gate electrodes of the second PFET and the first NFET are coupled to receive a second input signal, and the common drain terminal of the first and second NFETs is coupled to provide a NOR function output in accordance with the first and second FETs.

4. The electronic circuit of claim 2, wherein the first and second PFETs are both disposed above the buried oxide layer.

5. A semiconductor structure provided on a semiconductor-on-insulator (SOI) substrate, comprising:
a first single crystal semiconductor region disposed above the SOI substrate;
a gate electrode disposed in the first single crystal semiconductor region;
a buried oxide layer disposed below the first single crystal semiconductor region;
a second single crystal semiconductor region disposed below the buried oxide layer;
a buried element disposed In the second single crystal semiconductor region; and
an insulator layer disposed adjacent to at least one sidewall surface of the buried element.

6. The semiconductor structure of claim 5, wherein the insulator layer is also disposed adjacent to a bottom surface of the buried element.

7. The semiconductor structure of claim 5, wherein the buried element comprises an element selected from the group consisting of a buried gate, a body contact, a buried wire, and a buried capacitor.

8. The semiconductor structure of claim 7, wherein a region of the buried oxide layer located between the first single crystal semiconductor region and the buried gate includes a thin region, the thin region adapted to perform a function integral to the buried gate.

9. The semiconductor structure of claim 7, wherein a top surface of the body contact directly contacts the first single crystal semiconductor region.

10. The semiconductor structure of claim 7, further comprising at least one conducting via extending from an upper surface of the buried wire through the buried oxide layer to a top surface of the first single crystal semiconductor region.

11. The semiconductor structure of claim 5, wherein the buried element comprise a material selected from the group consisting of polysilicon, doped polysilicon, a refractory conductor, tungsten, and polycide.

* * * * *